US012660712B2

(12) United States Patent
Chen et al.

(10) Patent No.: US 12,660,712 B2
(45) Date of Patent: Jun. 16, 2026

(54) ELECTRICAL CONNECTION AND FORMING METHOD THEREOF

(71) Applicant: National Yang Ming Chiao Tung University, Hsinchu City (TW)

(72) Inventors: Chih Chen, Hsinchu City (TW); Shih-Chi Yang, Hsinchu City (TW)

(73) Assignee: National Yang Ming Chiao Tung University, Hsinchu City (TW)

( * ) Notice: Subject to any disclaimer, the term of this patent is extended or adjusted under 35 U.S.C. 154(b) by 402 days.

(21) Appl. No.: 18/348,365

(22) Filed: Jul. 7, 2023

(65) Prior Publication Data

US 2024/0136313 A1    Apr. 25, 2024
US 2024/0234351 A9    Jul. 11, 2024

(30) Foreign Application Priority Data

Oct. 21, 2022    (TW) .................................. 111140130

(51) Int. Cl.
$H10W\ 90/00$        (2026.01)
$H10W\ 72/00$        (2026.01)
(Continued)

(52) U.S. Cl.
CPC ...... $H10W\ 90/00$ (2026.01); $H10W\ 72/01935$ (2026.01); $H10W\ 72/952$ (2026.01);
(Continued)

(58) Field of Classification Search
CPC ......... H01L 24/08; H01L 24/05; H01L 24/80; H01L 25/0657; H01L 2224/0801;
(Continued)

(56) References Cited

U.S. PATENT DOCUMENTS 9,593,426 B2     3/2017  Willey et al.
11,121,104 B2 *  9/2021  Chen ....................... H01L 24/06
(Continued)

FOREIGN PATENT DOCUMENTS

CN        103730445 A     4/2014
TW          I432613 B     4/2014
(Continued)

OTHER PUBLICATIONS

Wei-Lan Chiu et al., "Nanotwinned Copper Hybrid Bonding and Wafer-On-Wafer Integration," 2020 IEEE 70th Electronic Components and Technology Conference (ECTC), 2020.
(Continued)

*Primary Examiner* — Mamadou L Diallo
(74) *Attorney, Agent, or Firm* — CKC & Partners Co., LLC

(57) ABSTRACT

An electrical connection includes a first driving substrate, a first adhesive layer, a first bonding pad a first bonding pad and a second bonding pad. The first driving substrate includes a first substrate and a first dielectric layer on the first substrate. The first adhesive layer is at a sidewall of the first dielectric layer of the first driving substrate. The first bonding pad is on the first substrate of the first driving substrate and in contact with the first adhesive layer, and the first bonding pad includes a plurality of grains, the grains are connected with each other, the grains include [111]-oriented copper grains, and a maximum width of the first bonding pad is equal to or less than 8 microns. The second bonding pad is on the first bonding pad.

13 Claims, 12 Drawing Sheets

10

(51) Int. Cl.

| | |
|---|---|
| *H10W 72/90* | (2026.01) |
| *H10W 80/00* | (2026.01) |
| *H10W 90/20* | (2026.01) |

(52) U.S. Cl.
CPC ........ *H10W 72/983* (2026.01); *H10W 80/312* (2026.01); *H10W 80/701* (2026.01); *H10W 80/721* (2026.01); *H10W 90/20* (2026.01); *H10W 90/792* (2026.01)

(58) Field of Classification Search
CPC . H01L 2224/08121; H01L 2224/08148; H01L 2224/80896; H01L 24/03; H01L 2224/02165; H01L 2224/03462; H01L 2224/05647; H01L 2224/80895; C25D 3/38; C25D 5/18; C25D 5/617; C25D 7/00
See application file for complete search history.

(56) References Cited

U.S. PATENT DOCUMENTS

| | | | |
|---|---|---|---|
| 2018/0350674 A1* | 12/2018 | Uzoh | H01L 21/76874 |
| 2019/0311897 A1 | 10/2019 | Kang et al. | |
| 2021/0020599 A1* | 1/2021 | Chen | H01L 24/83 |
| 2021/0407960 A1 | 12/2021 | Chen et al. | |
| 2022/0010446 A1* | 1/2022 | Banik | H01L 21/2885 |
| 2022/0208702 A1* | 6/2022 | Uzoh | H01L 24/08 |
| 2022/0285303 A1* | 9/2022 | Mirkarimi | H01L 24/08 |
| 2023/0019350 A1* | 1/2023 | Hwang | H01L 25/0652 |
| 2023/0140107 A1* | 5/2023 | Uzoh | H01L 21/6836 228/206 |
| 2023/0361066 A1* | 11/2023 | Chen | H01L 25/18 |
| 2023/0361069 A1* | 11/2023 | Ishikawa | H01L 24/08 |

FOREIGN PATENT DOCUMENTS

| | | |
|---|---|---|
| TW | 201432828 A | 8/2014 |
| TW | I455663 B | 10/2014 |
| TW | I482231 B | 4/2015 |
| TW | I490962 B | 7/2015 |
| TW | I686518 B | 3/2020 |
| WO | 2020092244 A1 | 5/2020 |

OTHER PUBLICATIONS

Laura Mirkarimi et al., "The Influence of Cu Microstructure on Thermal Budget in Hybrid Bonding," 2022 IEEE 72nd Electronic Components and Technology Conference (ECTC), 2022.
Kai-Cheng Shie et al., "Hybrid Bonding of Nanotwinned Copper/ organic Dielectrics with Low Thermal Budget," 2021 IEEE 71st Electronic Components and Technology Conference (ECTC), 2021.

* cited by examiner

ELECTRICAL CONNECTION AND FORMING METHOD THEREOF

CROSS-REFERENCE TO RELATED APPLICATION

This application claims priority to Taiwan Application Serial Number 111140130, filed Oct. 21, 2022, which is herein incorporated by reference in its entirety.

BACKGROUND

Field of Disclosure

The present disclosure relates to an electrical connection and a forming method thereof.

Description of Related Art

Integrated circuit chips and many kinds of electronic products develop towards smaller sizes continuously. Electrical connections of electronic devices in the electronic products also develop towards smaller size. Micro-scale or nano-scale bonding pads are commonly used in the electronic devices of the electronic devices. The bonding between the micro-scale or nano-scale bonding pads become more important, since the bonding quality directly affect the performance, quality and reliability of the final electronic products. When the size of the bonding is reduced, the metal compounds formed by conventional tin contacts and copper much adversely affect the mechanical characteristic of the bonding structure. The reliability of the final products is reduced accordingly. Better electrical connection structure and the forming method thereof are required to solve the problem mentioned above.

SUMMARY

In some embodiments, the electrical connection includes a first driving substrate, a first adhesive layer, a first bonding pad a first bonding pad and a second bonding pad. The first driving substrate includes a first substrate and a first dielectric layer on the first substrate. The first adhesive layer is at a sidewall of the first dielectric layer of the first driving substrate. The first bonding pad is on the first substrate of the first driving substrate and in contact with the first adhesive layer, and the first bonding pad includes a plurality of grains, the grains are connected with each other, the grains include [111]-oriented copper grains, and a maximum width of the first bonding pad is equal to or less than 8 microns. The second bonding pad is on the first bonding pad.

In some embodiments, an interface is between the first bonding pad and the second bonding pad, when the maximum width of the first bonding pad is in a range between 4 microns and 8 microns, at a substantial maximum width of the interface, a length covered by the [111]-oriented copper grains accounts for 60% of the substantial maximum width of the interface.

In some embodiments, the interface is tortuous.

In some embodiments, an interface is between the first bonding pad and the second bonding pad, when the maximum width of the first bonding pad is equal to or less than 4 microns, at a substantial maximum width of the interface, a length covered by the [111]-oriented copper grains accounts for 40% of the substantial maximum width of the interface.

In some embodiments, a sidewall of the first bonding pad comprises a non-[111]-oriented copper grain region, a bottom of the non-[111]-oriented copper grain region is higher than a bottom of the first bonding pad.

In some embodiments, a vertical distance between the bottom of the non-[111]-oriented copper grain region and the bottom of the first bonding pad is more than 50% of a thickness of the first bonding pad.

In some embodiments, a portion of the second bonding pad is in contact with the first dielectric layer.

In some embodiments, a forming method of an electrical connection, includes forming a first bonding pad by using a first periodic reverse electroplating, in which the first bonding pad includes a plurality of [111]-oriented copper grains, and a maximum width of the first bonding pad is equal to or less than 8 microns, forming a second bonding pad by using a second periodic reverse electroplating, in which the second bonding pad includes a plurality of [111]-oriented copper grains, and a maximum width of the second bonding pad is equal to or less than 8 microns, and bonding a surface of the first bonding pad to a surface of the second bonding pad.

In some embodiments, forming the first bonding pad by using the first periodic reverse electroplating includes providing an electroplating apparatus including an anode immersed in a electroplating solution, placing a first driving substrate at a cathode of the electroplating apparatus, in which the first driving substrate has a recess, and providing a pulse current to the first driving substrate, in which the pulse current comprises a plurality of pulse periods each comprising a forward current and a backward current, a current density of the forward current is in a range between 6 A/dm$^2$ to 12 A/dm$^2$, and a current density of the backward current is in a range between 4 A/dm$^2$ to 8 A/dm$^2$.

In some embodiments, a duration of the forward current is in a range between 75 milliseconds to 85 milliseconds, and a duration of the backward current is in a range between 4 milliseconds to 8 milliseconds.

In some embodiments, a bonding temperature of bonding the surface of the first bonding pad to the surface of the second bonding pad is between 70 degree Celsius and 250 degree Celsius.

In some embodiments, at a substantial maximum width of the surface of the first bonding pad, a length covered by the [111]-oriented copper grains accounts for 60% of the substantial maximum width of the surface of the first bonding pad.

In some embodiments, at the substantial maximum width of the surface of the first bonding pad, a length covered by the [111]-oriented copper grains accounts for 90% of the substantial maximum width of the surface of the first bonding pad.

In some embodiments, an interface is formed after bonding the surface of the first bonding pad to the surface of the second bonding pad, when a maximum width of the first bonding pad is in a range between 4 microns and 8 microns, at a substantial maximum width of the interface, a length covered by the [111]-oriented copper grains accounts for 60% of the substantial maximum width of the interface.

In some embodiments, an interface is formed after bonding the surface of the first bonding pad to the surface of the second bonding pad, when a maximum width of the first bonding pad is less than 4 microns, at a substantial maximum width of the interface, a length covered by the [111]-oriented copper grains accounts for 40% of the substantial maximum width of the interface.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
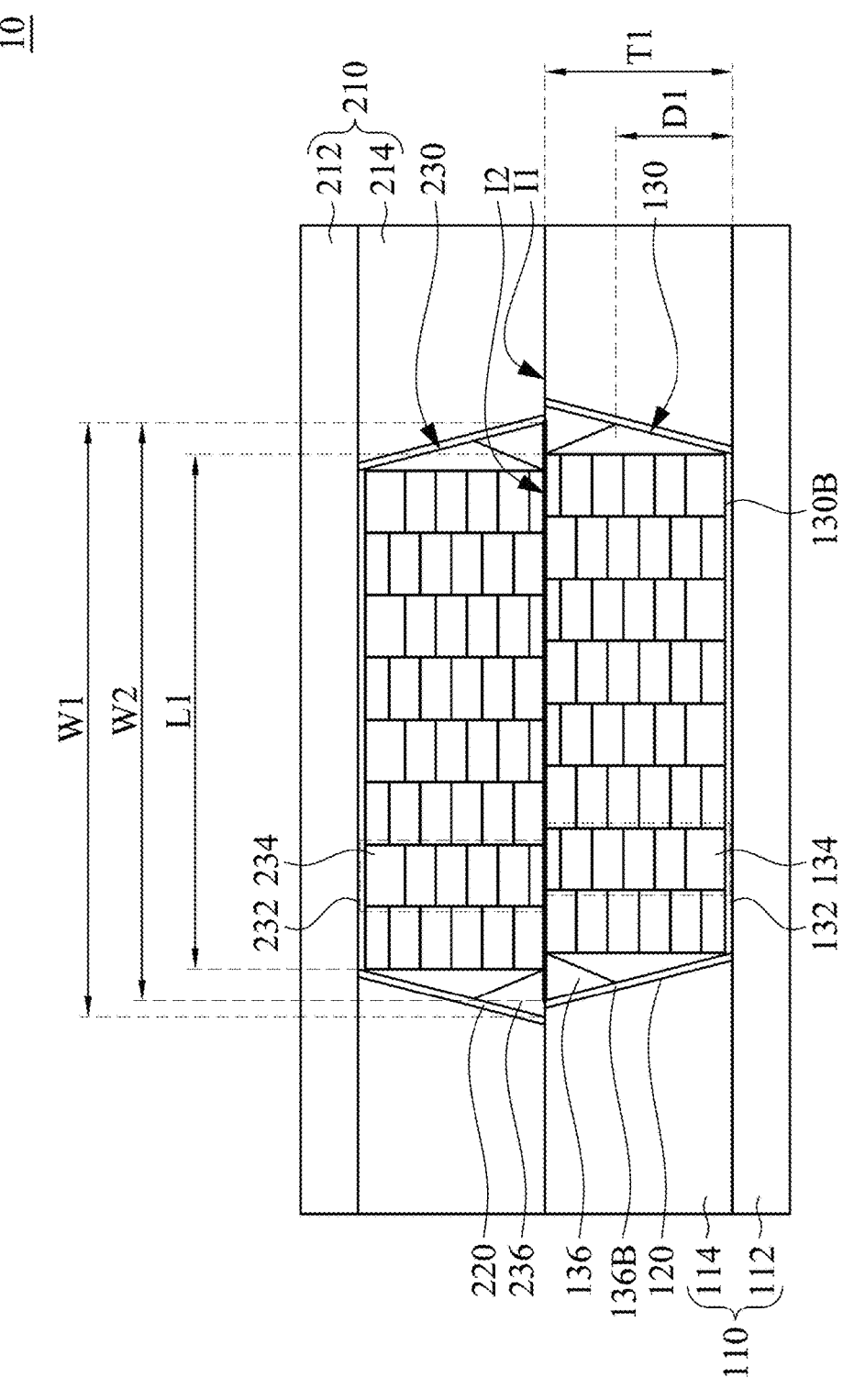
FIG. 1A illustrates a cross-section view of an electrical connection in some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

An [111]-oriented copper layer is formed by using a periodic reverse electroplating in some embodiments of the present disclosure. The nanotwinned-copper layer formed by this method may be used as a connection with small width, such as equal to or less than 8 microns. The proportion of the [111]-oriented copper grains is high at the bonding interface of the copper layer, such as higher than 60%. Therefore, the electrical connection may be bonded at a lower temperature to reduce the thermal budget of the process.

FIG. 1A illustrates a cross-section view of an electrical connection 10 in some embodiments of the present disclosure. The electrical connection 10 includes a first driving substrate 110, a first adhesive layer 120, a first bonding pad 130, a second driving substrate 210, a second adhesive layer 220 and a second bonding pad 230. In some embodiments, FIG. 1A illustrates the cross-section view of the electrical connection 10 at the substantial maximum width.

The first driving substrate 110 includes a first substrate 112 and a first dielectric layer 114 on the first substrate 112. The first substrate 112 may be any suitable substrate, such as silicon substrate, ceramic substrate, glass fiber substrate, printed circuit board, metal substrate, plastic substrate, or the like. In some embodiments, the first substrate 112 may also include active device layers, redistribution layer or other suitable layers. In some embodiments, the first dielectric layer 114 may be any suitable dielectric material, such as silicon oxide, silicon carbon nitride, or the like.

The first adhesive layer 120 is at the sidewall of the first dielectric layer 114 of the first driving substrate 110. The first adhesive layer 120 is also on the first substrate 112 to be in contact with the first substrate 112. The first adhesive layer 120 may be made of any suitable metal material, such as tantalum or titanium. The first adhesive layer 120 may be beneficial for the formation of the [111]-oriented copper grains in the first bonding pad 130.

The first bonding pad 130 is on the first substrate 112 of the first driving substrate 110 and in contact with the first adhesive layer 120. The first bonding pad 130 includes a plurality of grains 132. The grains 132 are connected with each other, the grains 132 include [111]-oriented copper grains 134, and the maximum width of the first bonding pad 130 is equal to or less than 8 microns. When angle between the crystal orientation and the normal vector of the substrate is less than 15 degrees, the grain is defined as a [111]-oriented grain in the present disclosure. In some embodiments, a transition layer including small grains (not illustrated) is between the first adhesive layer 120 and the first bonding pad 130, and the grains in the transition layer are not [111]-oriented grains.

The sidewall of the first bonding pad 130 includes a non-[111]-oriented copper grain region 136, and the bottom 136B of the non-[111]-oriented copper grain region 136 is higher than the bottom 130B of the first bonding pad 130. The copper grains are not grown in the crystal orientation in the non-[111]-oriented copper grain region 136. For example, the copper grains are grown from the first adhesive layer 120 along the orientation inclined to the first substrate 112 in the non-[111]-oriented copper grain region 136. In some embodiments, a vertical direction D1 between the bottom 136B of the non-[111]-oriented copper grain region 136 and the bottom 130B of the first bonding pad 130 is 50% of the thickness T1 of the first bonding pad. In some embodiments, the thickness T1 of the first bonding pad is 1 micron.

The second driving substrate 210, the second adhesive layer 220 and the second bonding pad 230 is over the first driving substrate 110, the first adhesive layer 120 and the first bonding pad 130. The second driving substrate 210 includes a second substrate 212 and a second dielectric layer 214. The second substrate 212 is on the second dielectric layer 214. The second bonding pad 230 are formed of grains 232, and each grains 232 include [111]-oriented copper grains 234. The sidewall of the second bonding pad 230 includes a non-[111]-oriented copper grain region 236. Other details of the second driving substrate 210, the second adhesive layer 220 and the second bonding pad 230 are similar to or the same as the details of the first driving substrate 110, the first adhesive layer 120 and the first bonding pad 130 respectively, so the details are not described herein repeatedly.

An interface I1 is between the second dielectric layer 214 of the second driving substrate 210 and the first dielectric layer 114 of the first driving substrate 110. The second bonding pad 230 is on the first bonding pad 130, and an interface I2 is between the first bonding pad 130 and the second bonding pad 230. When the maximum width W1 of the first bonding pad 130 is in a range between 4 microns to 8 microns (for example, when the first bonding pad 130 is circle, the maximum width W1 is the diameter of the first bonding pad 130), at the substantial maximum width W2 of the interface I2, a length L1 covered by the [111]-oriented copper grains accounts for 60% of the substantial maximum width W2 of the interface I2. When the maximum width W1 of the first bonding pad 130 is less than 4 microns, at the substantial maximum width W2 of the interface I2, a length L1 covered by the [111]-oriented copper grains accounts for 40% of the substantial maximum width W2 of the interface I2. In the present disclosure, the term "substantial maximum width" is referred to the width range greater than 70% of the maximum width. For example, if the maximum width of the interface I2 is 4 microns, the location where the width of the interface I2 is greater than 2.8 microns may be referred as the substantial maximum width W2. In the present disclosure, as long as one of the [111]-oriented copper grains 234 of the second bonding pad 230 or the [111]-oriented copper grains 134 of the first bonding pad 130 is at the length L1, it is viewed as that the [111]-oriented copper grains cover the length L1.

The [111]-oriented copper grain structure has a good mechanical strength and electrical performance, and has characteristic of anti-electromigration. Moreover, the bonding pad with small size and high proportion of [111]-oriented copper grains at the interface I2 is formed in some embodiments of the present disclosure. The [111]-oriented copper grains are beneficial for heterojunction of copper/silicon dioxide at low temperature, so the thermal budget of the process may be reduced. That is, at the interface I2, if the proportion of the non-[111]-oriented copper grain region 136 of the first bonding pad 130 and the non-[111]-oriented copper grain region 236 of the second bonding pad 230 accounting for the entire grains is higher, it is unfavorable for heterojunction of copper/silicon dioxide at low temperature.

Figure 1B:
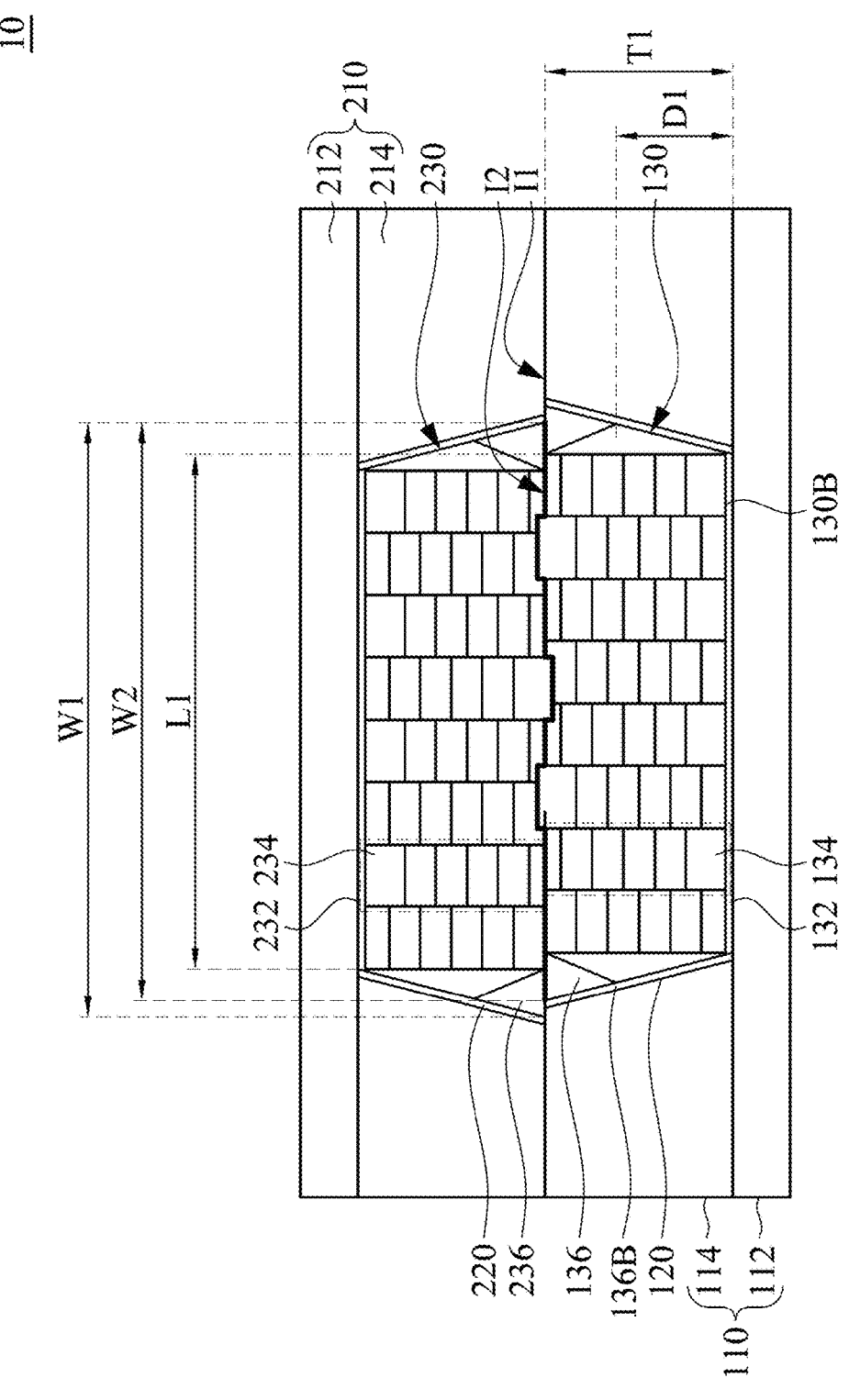
FIG. 1B illustrates a cross section of the electrical connection in some other embodiments of the present disclosure.

FIG. 1B illustrates a cross section of the electrical connection 10 in some other embodiments of the present disclosure. The difference between the electrical connection 10 in FIG. 1B and the electrical connection 10 in FIG. 1A is that the [111]-oriented copper grains 134 and the [111]-oriented copper grains 234 of the electrical connection 10 in FIG. 1B may grow into the second bonding pad 230 and the first bonding pad 130 respectively. Therefore, the interface I2 may be tortuous.

Figure 2:
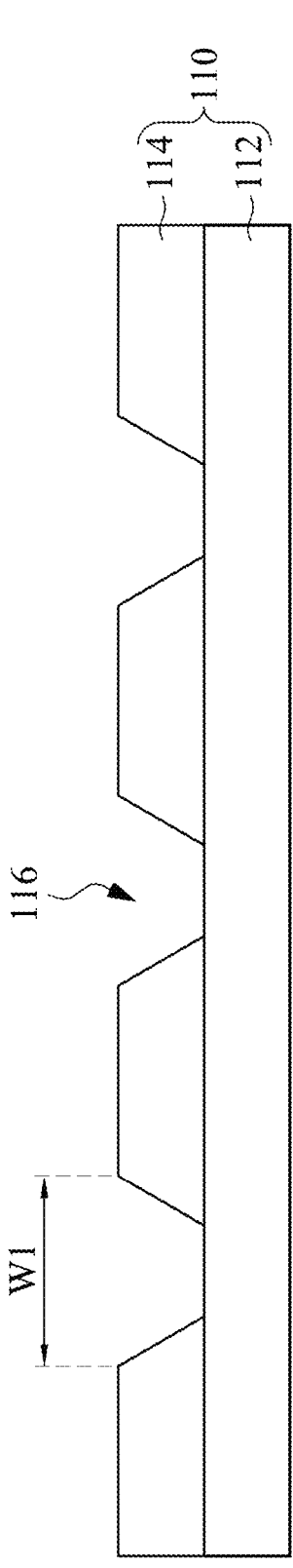
FIGS. 2-8 illustrate cross-section views of the manufacturing process of the electrical connection in some embodiments of the present disclosure.

FIGS. 2-8 illustrate cross-section views of the manufacturing process of the electrical connection 10 in some embodiments of the present disclosure. Referring to FIG. 2, the first driving substrate 110 is provided. The first driving substrate 110 includes the first substrate 112 and the first dielectric layer 114. Recesses 116 are formed in the first dielectric layer 114 by etching process. The recesses 116 are in the first dielectric layer 114, and the recesses 116 expose the underlying first substrate 112. The sidewall of the recesses 116 may be inclined or perpendicular to the first substrate 112. For example, the sidewall of the recesses 116 may be inclined to the first substrate 112, as shown in FIG. 2. The recesses 116 are used to accommodate bonding pads in the subsequent process. Therefore, the recesses 116 may be formed based on the sizes of the bonding pads to be formed. In some embodiments, the maximum widths W1 of the recesses 116 are equal to or less than 8 microns.

Figure 3:
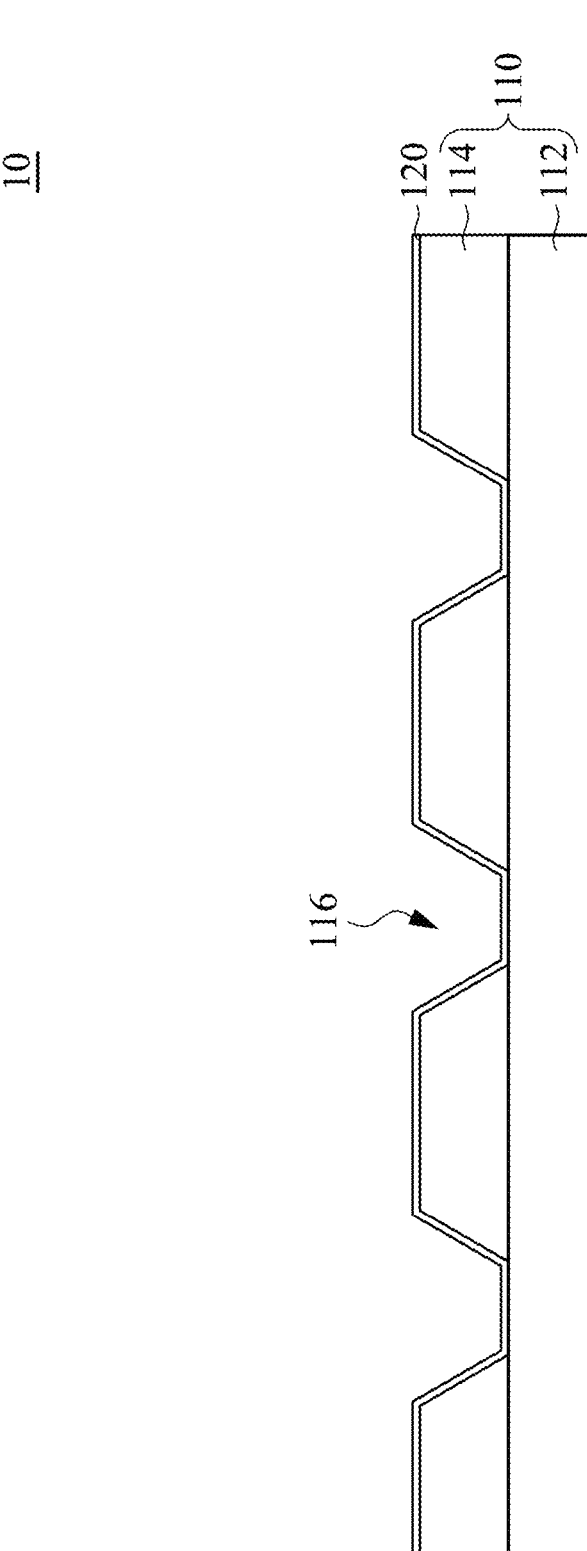

Referring to FIG. 3, the first adhesive layer 120 is formed on the first driving substrate 110. The first adhesive layer 120 may be conformal to the top surface of the first driving substrate 110. That is, the first adhesive layer 120 may cover the top surface of the first dielectric layer 114, the sidewall of the recesses 116 and the bottom of the recesses 116. In some embodiments, the first adhesive layer 120 may be formed by any suitable process, such as CVD, PVD, or the like.

Figure 4:
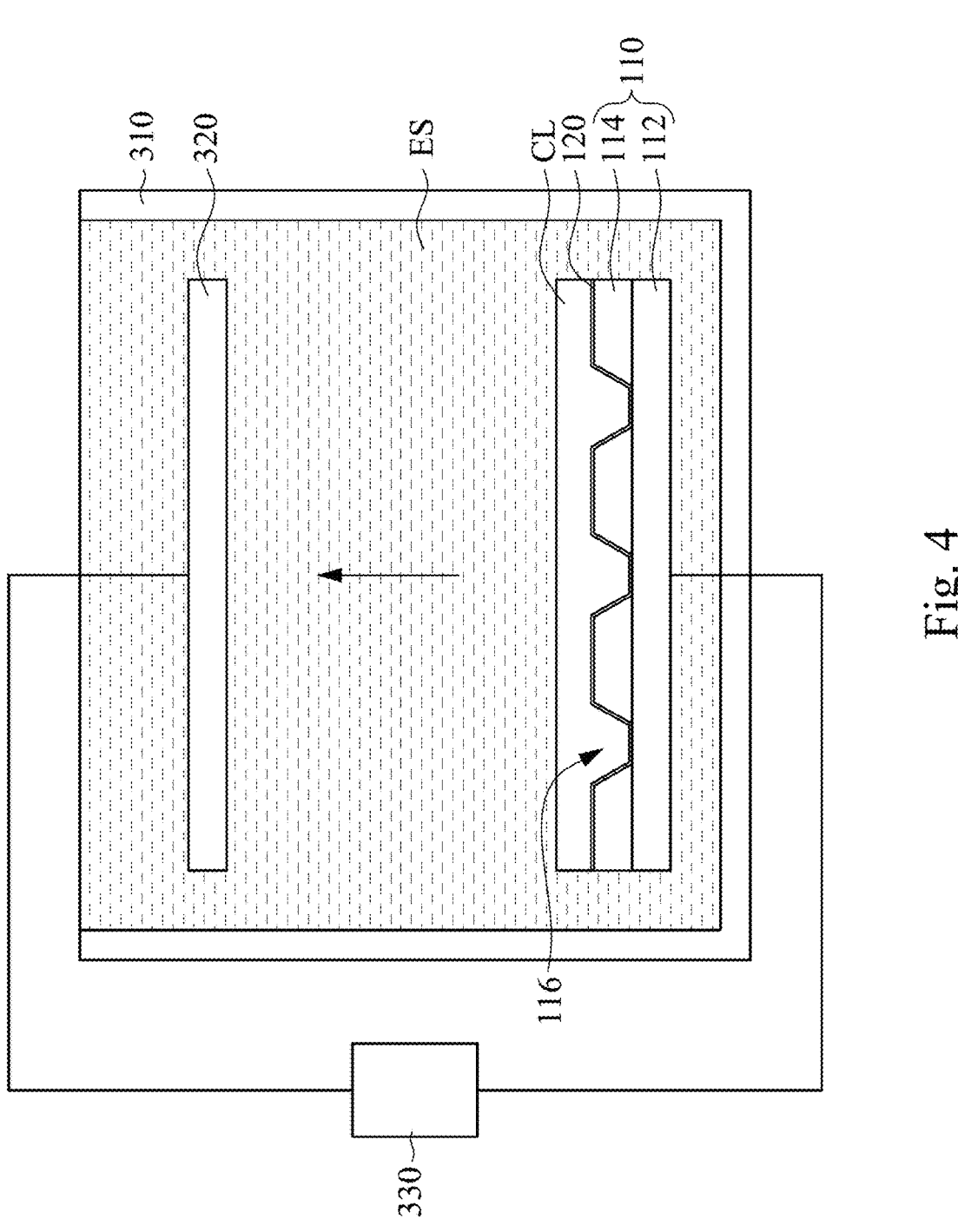
Figure 5:
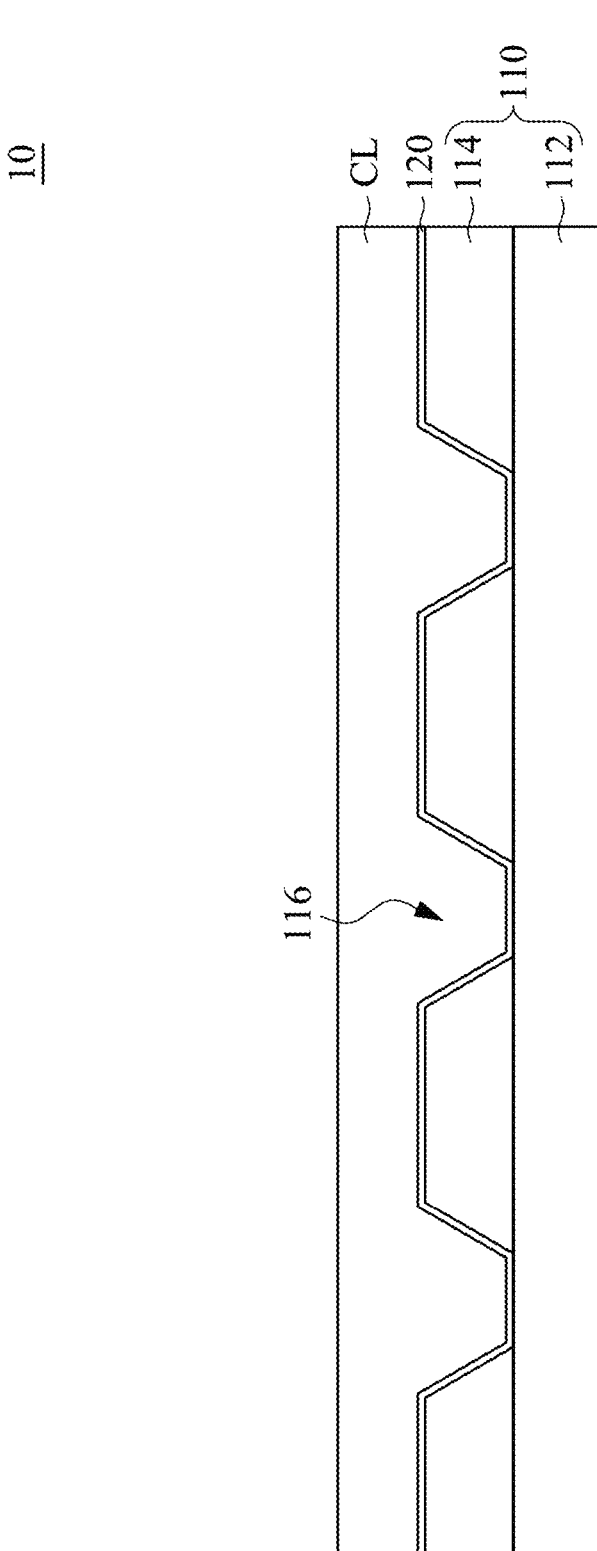
Figure 6:
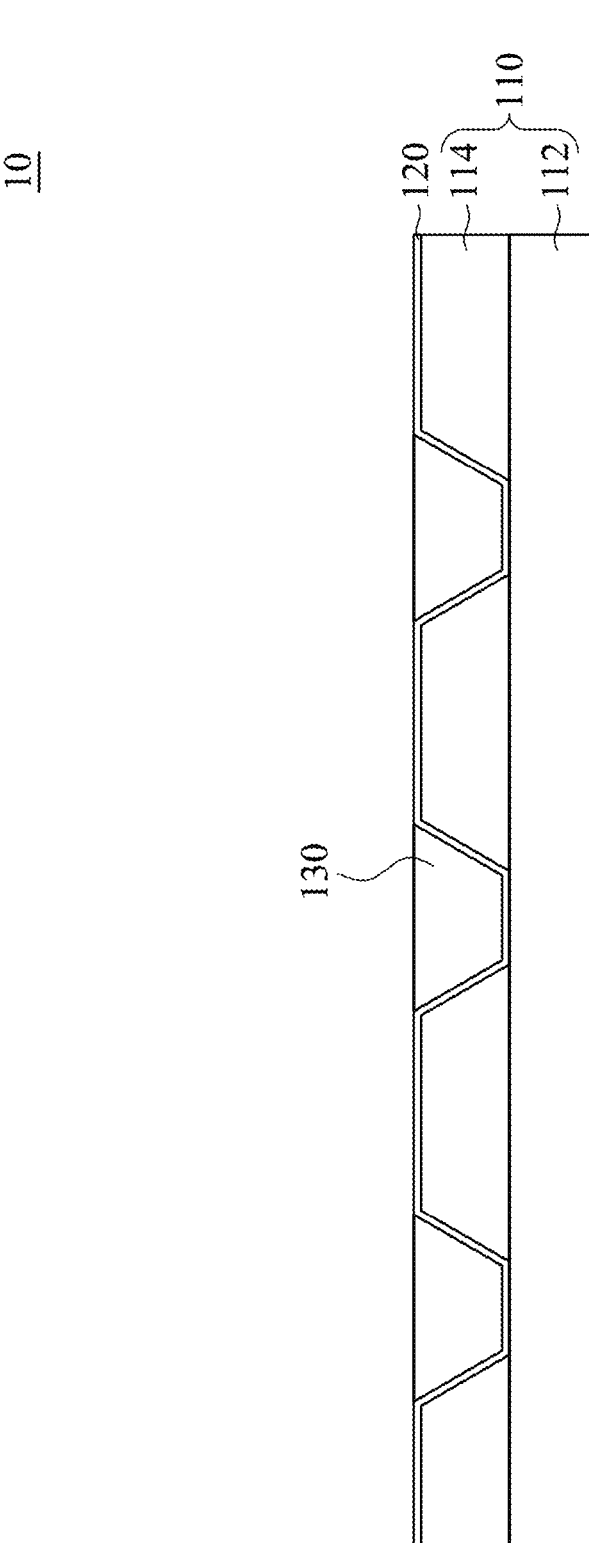

FIGS. 4-6 are cross-section views of the manufacturing process of the first bonding pad 130 and the second bonding pad 230 (see FIGS. 1A-1B). The first bonding pad 130 may be formed by periodic reverse electroplating. The first bonding pad 130 includes [111]-oriented copper grains, and the maximum width of the first bonding pad 130 is equal to or less than 8 microns. Subsequently, the second bonding pad 230 may be formed by periodic reverse electroplating. The second bonding pad 230 includes [111]-oriented copper grains, and the maximum width of the second bonding pad 230 is equal to or less than 8 microns.

Specifically, referring to FIG. 4, firstly, an electroplating apparatus 300 is provided. The electroplating apparatus 300 includes the shell 310, and electroplating solution ES are filled in the shell 310. The electroplating apparatus 300 further includes an anode 320 immersed in the electroplating solution ES, and the material of the anode 320 is metal copper, phosphor bronze or inert anode (such as platinum plated titanium). The anode 320 is further connected to the power supply 30. The electroplating solution ES includes copper sulfate (concentration of copper ions is 20-60 g/L), chloride ion (concentration is 10-100 ppm) or methanesulfonic acid (concentration is 80-120 g/L), and other additive such as surfactant or lattice modification agent may be added. In some embodiments, the additive may be 108C from CHEMLEADER CORPORATION. Optionally, the electroplating solution ES in the present disclosure further includes organic acid (such as methanesulfonic acid) or gelatin to adjust the structure and size of the grains.

Subsequently, the first driving substrate 110 is placed at the cathode of the electroplating apparatus 300, and the first driving substrate 110 is also connected to the power supply 330. Subsequently, the first driving substrate 110 provides a pulse current, and the pulse current includes a plurality of pulse periods each including a forward current and a backward current. The current density of the forward current is in a range between 6 ASD (A/dm$^2$) to 12 ASD (A/dm$^2$), and a current density of the backward current is in a range between 4 ASD (A/dm$^2$) to 8 ASD (A/dm$^2$). A duration of the forward current is in a range between 75 milliseconds to 85 milliseconds, and a duration of the backward current is in a range between 4 milliseconds to 8 milliseconds. During applying the forward current of the periodic reverse electroplating, a [111]-oriented copper grain layer CL grows on the first adhesive layer 120 in a direction pointed by the arrow. At this time, since the current density is higher near the sidewall of the recesses 116, it is easy to cause sidewall effect. That is, the grains grow faster near the sidewall of the recesses 116, and the grains may not be [111]-oriented. During applying the backward current of the periodic reverse electroplating, the surface of the [111]-oriented copper grain layer CL may be dissolved in the electroplating solution ES. Since the duration of the backward current is much lower than the duration of the forward current, only a small part of the [111]-oriented copper grain layer CL is dissolved. During this period, the non-[111]-oriented copper grains with unexpected growth direction near the sidewall of the recesses 116 are also dissolved, and the dissolution speed is higher than that of the [111]-oriented copper grains. After applying the forward current and the backward current several times repeatedly, the first bonding pad with small size is formed in the recesses 116 with small size, and the non-[111]-oriented copper grain regions near the sidewall of the recesses 116 becomes smaller. The structure after electroplating is shown in FIG. 5, the [111]-oriented copper grain layer CL thoroughly covers the first adhesive layer 120. That is, the [111]-oriented copper grains are in the recesses 116 and on the horizontal surface of the first adhesive layer 120.

Referring to FIG. 6, a chemical mechanical planarization process is performed to polish excess portion of the [111]-oriented copper grain layer CL. The [111]-oriented copper grain layer CL in the recesses 116 remains, and the [111]-oriented copper grain layer CL in the recesses 116 becomes the first bonding pads 130.

Figure 7:
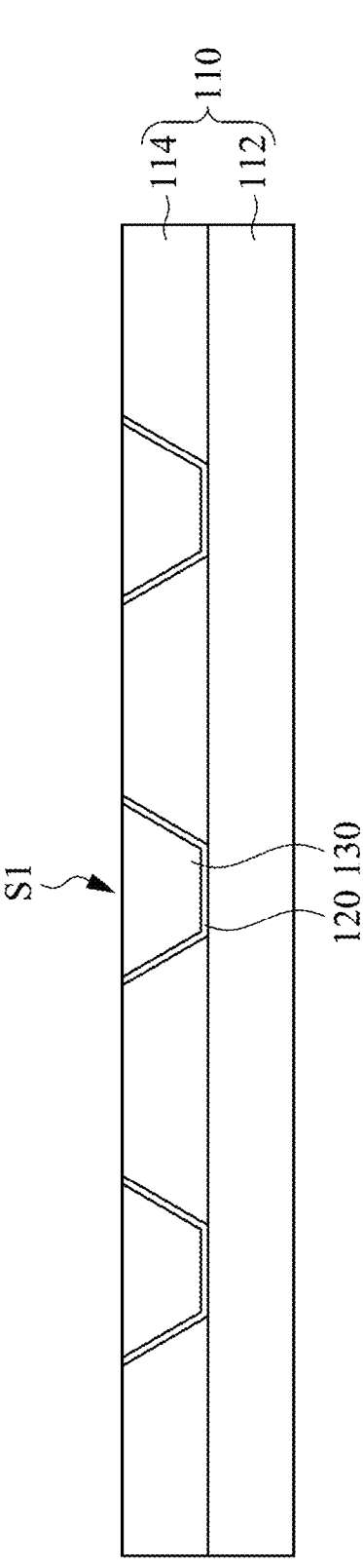

Referring to FIG. 7, a chemical mechanical planarization process is performed to polish excess portion of the first adhesive layer 120. The first adhesive layer 120 in the recesses 116 remains. The first adhesive layer 120 in the recesses 116 are covered by the first bonding pad 130 and will not be removed. The first bonding pad 130 has a surface S1 distal to the first substrate 112. At the surface S1 of the first bonding pad 130, the proportion of the [111]-oriented copper grains accounting to the overall surface of the bonding pad is high. For example, when the maximum width of the first bonding pad 130 is in a range between 4 microns and 8 microns, at a substantial maximum width of the surface S1 of the first bonding pad, a length covered by the [111]-oriented copper grains accounts for 60% of the substantial maximum width of the surface of the first bonding pad. When the maximum width of the first bonding pad 130 is less than 4 microns, at a substantial maximum width of the surface S1 of the first bonding pad, a length covered by the [111]-oriented copper grains accounts for 40% of the substantial maximum width of the surface of the first bonding pad.

After the process in FIG. 7, the processes in FIG. 2-7 may be repeated to form the second adhesive layer 220 and the second bonding pad 230 on the second driving substrate 210. That is, the formation process of the first adhesive layer 120 and the second adhesive layer 220 are the same, and the formation process of the first bonding pad 130 and the second bonding pad 230 are the same.

Figure 8:
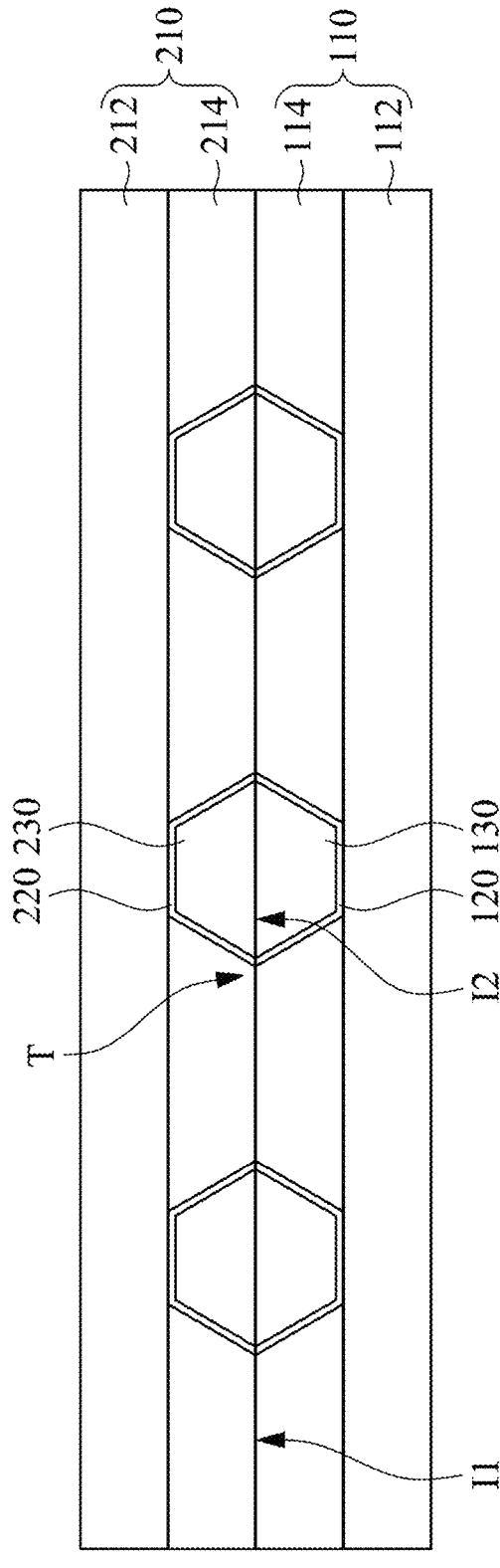

Referring to FIG. 8, the surface S1 of the first bonding pad 130 is bonded to the surface of the second bonding pad 230, and the surface S1 of the first bonding pad 130 and the surface of the second bonding pad 230 become the interface I2 between the first bonding pad 130 and the second bonding pad 230. Specifically, a hybrid bonding process is performed to bond the surface of the first bonding pad 130 and the surface of the second bonding pad 230. During the hybrid bonding process, the surface of the first dielectric layer 114 is also bonded to the surface of the second dielectric layer 214, and the interface I1 is formed between the first dielectric layer 114 and the second dielectric layer 214. The first adhesive layer 120 and the second adhesive layer 220 are bonded near the interface I2, and the first adhesive layer 120 and the second adhesive layer 220 may form an inflection portion T. That is, there is an obvious inflection between the first adhesive layer 120 and the second adhesive layer 220 near the interface I2, and the first adhesive layer 120 and the second adhesive layer 220 are not arranged along a straight line. Since the proportion of the [111]-oriented copper grains accounting to the overall grains is high at the surface S1 of the first bonding pad, the hybrid bonding process may be performed at low temperature. In some embodiments, a bonding temperature of bonding the surface of the first bonding pad 130 to the surface of the second bonding pad 230 is between 70 degree Celsius and 250 degree Celsius.

Figure 9:
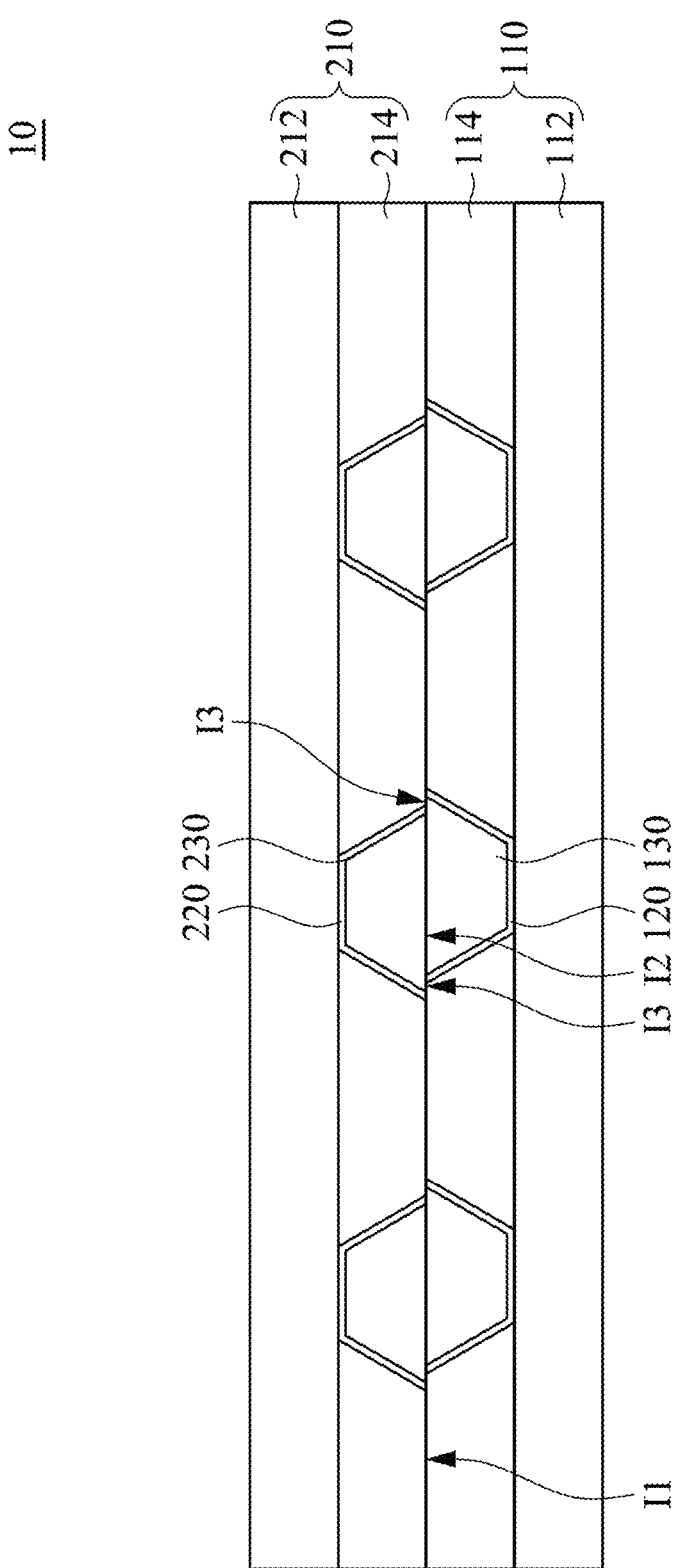
FIG. 9 illustrates a cross-section view of the electrical connection in some other embodiments of the present disclosure.

FIG. 9 illustrates a cross-section view of the electrical connection 10 in some other embodiments of the present disclosure. In some embodiments, the first bonding pad 130 may not be aligned with the second bonding pad 230 after bonding. Therefore, a portion of the first bonding pad 130 may be in contact with the second dielectric layer 214 and an interface I3 is formed, and a portion of the second bonding pad 230 may be in contact with the first dielectric layer 114 and an interface I3 is formed. Since the proportion of the [111]-oriented copper grains accounting to the overall grains is high at the surface S1 of the first bonding pad, the hybrid bonding process may be performed at low temperature. In some embodiments, a bonding temperature of bonding the surface of the first bonding pad 130 to the surface of the second bonding pad 230 is between 70 degree Celsius and 250 degree Celsius.

Figures 10, 11:
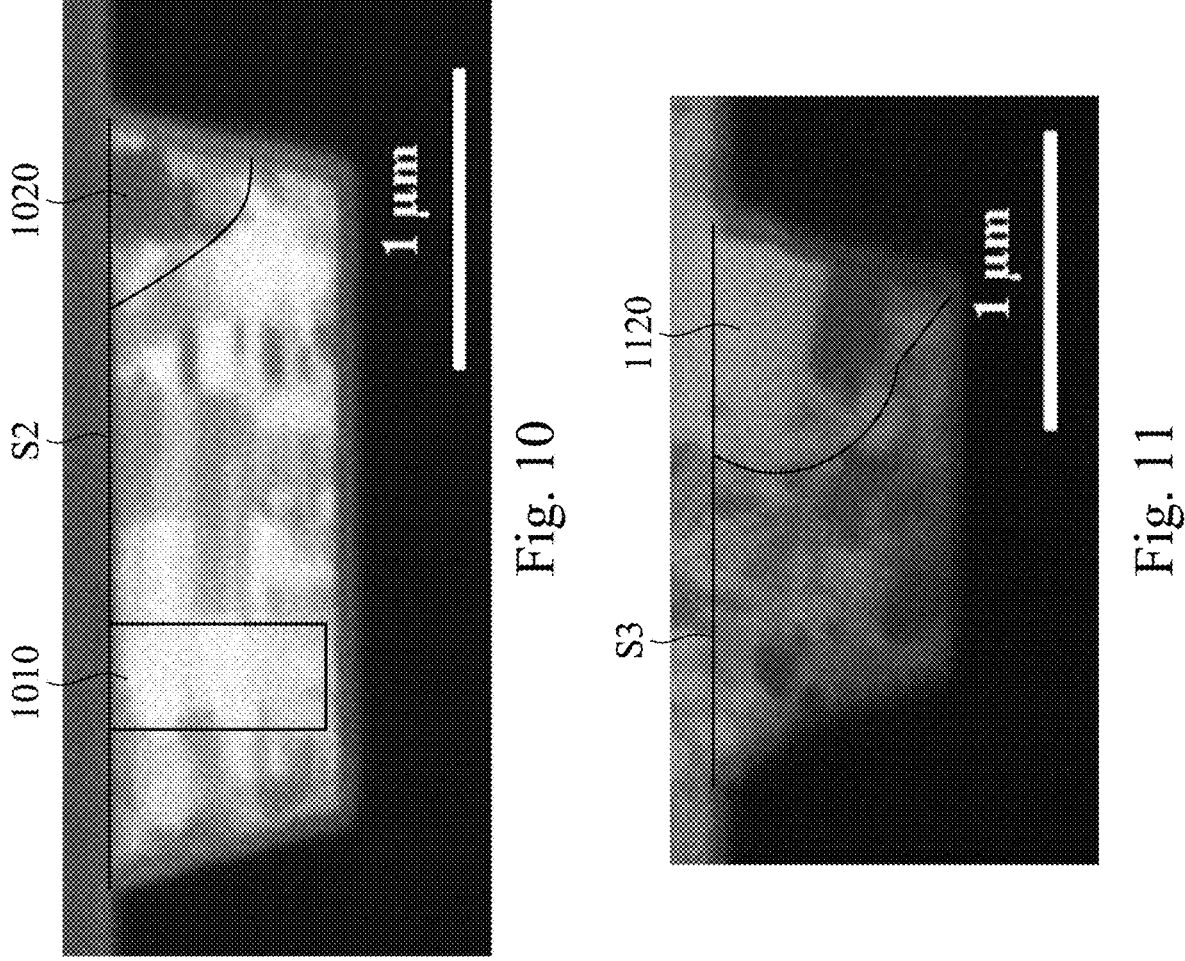
FIGS. 10-11 provide a bonding pad formed in some embodiments of the present disclosure and a bonding pad formed by prior art respectively.

FIGS. 10-11 provide a bonding pad formed in some embodiments of the present disclosure and a bonding pad formed by prior art respectively. In FIG. 10, a periodic reverse electroplating is performed to form the bonding pad, and the parameters of the periodic reverse electroplating are set as following: the current density of the forward current is 12 ASD, the current density of the backward current is 6 ASD, a duration of the forward current in each pulse period is 80 milliseconds, a duration of the backward current in each pulse period is 4 milliseconds, and a total duration of electroplating is 84 seconds. The electroplating solution is 0.8M copper(II) sulfate pentahydrate ($CuSO_4 \cdot 5H_2O$) solution, 40 ppm hydrochloric acid, 1M sulfuric acid, additive. FIG. 11 is the control group of FIG. 10. In FIG. 11, a direct current electroplating is performed to form the bonding pad, and the parameters of the direct current electroplating are set as following: the current density is 12 ASD, and a total duration of electroplating is 90 seconds.

FIG. 10 illustrates a focused ion beam (FIB) image of the bonding pad with a width of 2 microns formed by periodic reverse electroplating. FIG. 11 illustrates a FIB image of the bonding pad with a width of 2 microns formed by direct current electroplating. It is observed that the bonding pad in FIG. 10 has more obvious column structures 1010 growing from the bottom of the recess. That is, the proportion of the [111]-oriented copper grains is higher. Moreover, the size of the non-[111]-oriented copper grain regions 1120 in FIG. 11 is larger than the size of the non-[111]-oriented copper grain regions 1020 in FIG. 10. That is, the bonding pad formed by periodic reverse electroplating is less affected by the sidewall effect. In some embodiments, based on the electron back scatter diffraction (EBSD), at a substantial maximum width of the surface S2 of the first bonding pad in FIG. 10, a length covered by the [111]-oriented copper grains accounts for 50% of the substantial maximum width of the surface. The direct current electroplating cannot be used to form [111]-oriented copper grains at the surface S3 of the bonding pad of the FIG. 11.

Figure 12:
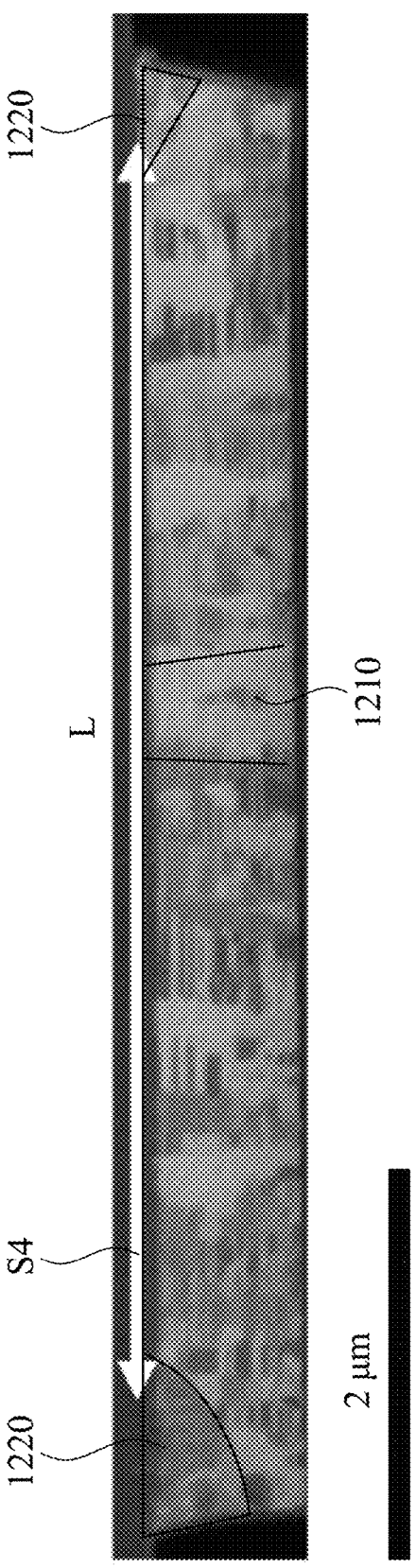
FIG. 12 illustrates a focused ion beam (FIB) image of the bonding pad with a width of 8 microns formed by periodic reverse electroplating.

FIG. 12 illustrates a focused ion beam (FIB) image of the bonding pad with a width of 8 microns formed by periodic reverse electroplating. It is observed that the bonding pad in FIG. 12 has obvious column structures 1210 growing from the bottom of the recess. Moreover, the non-[111]-oriented copper grain region 1220 is not in contact with the bottom of the bonding pad. That is, the bonding pad formed by periodic reverse electroplating is less affected by the sidewall effect. In some embodiments, at a substantial maximum width of the surface S4, a length L covered by the [111]-oriented copper grains accounts for 90% of the substantial maximum width of the surface S4.

Although some embodiments of the present disclosure emphasis on the electrical connections formed by bonding different bonding pads. However, some embodiments of the present disclosure are not limited thereto. For example, the periodic reverse electroplating may also be used to form wires in the dielectric layer, and the wires are bonded with each other in perpendicular. The proportion of the [111]-oriented copper grains is high at the surface of the wire, which is beneficial for heterojunction of copper/silicon dioxide at low temperature.

As mentioned above, periodic reverse electroplating may be used to form bonding pads with small sizes, such as the width equal to or less than 8 microns. Meanwhile, periodic reverse electroplating may effectively reduce the size of the non-[111]-oriented copper grain region in bonding pads with small sizes, so that the proportion of the [111]-oriented copper grains increase. This is beneficial for heterojunction of copper/silicon dioxide at low temperature, so the thermal budget of the process may be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electrical connection, comprising:
a first driving substrate comprising a first substrate and a first dielectric layer on the first substrate;
a first adhesive layer at a sidewall of the first dielectric layer of the first driving substrate;
a first bonding pad on the first substrate of the first driving substrate and contact with the first adhesive layer, wherein the first bonding pad comprises a plurality of grains, the grains are connected with each other, the grains include [111]-oriented copper grains, and a maximum width of the first bonding pad is equal to or less than 8 microns, wherein a sidewall of the first bonding pad comprises a non-[111]-oriented copper grain region, a bottom of the non-[111]-oriented copper grain region is higher than a bottom of the first bonding pad; and
a second bonding pad on the first bonding pad.

2. The electrical connection of claim 1, wherein an interface is between the first bonding pad and the second bonding pad, when the maximum width of the first bonding pad is in a range between 4 microns and 8 microns, at a substantial maximum width of the interface, a length covered by the [111]-oriented copper grains accounts for 60% of the substantial maximum width of the interface.

3. The electrical connection of claim 2, wherein the interface is tortuous.

4. The electrical connection of claim 1, wherein an interface is between the first bonding pad and the second bonding pad, when the maximum width of the first bonding pad is equal to or less than 4 microns, at a substantial maximum width of the interface, a length covered by the [111]-oriented copper grains accounts for 40% of the substantial maximum width of the interface.

5. The electrical connection of claim 1, wherein a vertical distance between the bottom of the non-[111]-oriented copper grain region and the bottom of the first bonding pad is more than 50% of a thickness of the first bonding pad.

6. The electrical connection of claim 1, wherein a portion of the second bonding pad is in contact with the first dielectric layer.

7. A forming method of an electrical connection, comprising:
forming a first bonding pad by using a first periodic reverse electroplating, wherein the first bonding pad comprises a plurality of [111]-oriented copper grains, and a maximum width of the first bonding pad is equal to or less than 8 microns, wherein forming the first bonding pad by using the first periodic reverse electroplating comprises:
providing an electroplating apparatus comprising an anode immersed in a electroplating solution;
placing a first driving substrate at a cathode of the electroplating apparatus, wherein the first driving substrate has a recess; and
providing a pulse current to the first driving substrate, wherein the pulse current comprises a plurality of pulse periods each comprising a forward current and a backward current, a current density of the forward current is in a range between 6 A/dm$^2$ to 12 A/dm$^2$, and a current density of the backward current is in a range between 4 A/dm$^2$ to 8 A/dm$^2$;
forming a second bonding pad by using a second periodic reverse electroplating, wherein the second bonding pad comprises a plurality of [111]-oriented copper grains, and a maximum width of the second bonding pad is equal to or less than 8 microns; and
bonding a surface of the first bonding pad to a surface of the second bonding pad.

8. The forming method of claim 7, wherein a duration of the forward current is in a range between 75 milliseconds to 85 milliseconds, and a duration of the backward current is in a range between 4 milliseconds to 8 milliseconds.

9. The forming method of claim 7, wherein a bonding temperature of bonding the surface of the first bonding pad to the surface of the second bonding pad is between 70 degree Celsius and 250 degree Celsius.

10. The forming method of claim 7, wherein at a substantial maximum width of the surface of the first bonding pad, a length covered by the [111]-oriented copper grains accounts for 60% of the substantial maximum width of the surface of the first bonding pad.

11. The forming method of claim 10, wherein at the substantial maximum width of the surface of the first bonding pad, a length covered by the [111]-oriented copper grains accounts for 90% of the substantial maximum width of the surface of the first bonding pad.

12. The forming method of claim 7, wherein an interface is formed after bonding the surface of the first bonding pad to the surface of the second bonding pad, when a maximum width of the first bonding pad is in a range between 4 microns and 8 microns, at a substantial maximum width of the interface, a length covered by the [111]-oriented copper grains accounts for 60% of the substantial maximum width of the interface.

13. The forming method of claim 7, wherein an interface is formed after bonding the surface of the first bonding pad to the surface of the second bonding pad, when a maximum width of the first bonding pad is less than 4 microns, at a substantial maximum width of the interface, a length covered by the [111]-oriented copper grains accounts for 40% of the substantial maximum width of the interface.

* * * * *